United States Patent [19]

Yamada et al.

[11] Patent Number: 5,504,984
[45] Date of Patent: Apr. 9, 1996

[54] METHODS OF MANUFACTURING $NB_3AL$ SUPERCONDUCTING WIRE AND COIL

[75] Inventors: Yuichi Yamada, Osaka; Toshinari Ando, Ibaraki; Yoshikazu Takahashi, Ibaraki; Masataka Nishi, Ibaraki; Hiroshi Tsuji, Ibaraki; Hideo Nakajima, Ibaraki, all of Japan

[73] Assignees: Sumitomo Electric Industries, Ltd., Osaka; Japan Atomic Energy Research Institute, Tokyo, both of Japan

[21] Appl. No.: 165,929

[22] Filed: Dec. 13, 1993

[51] Int. Cl.⁶ .................................................. H01L 39/24
[52] U.S. Cl. .............................. 29/599; 148/98; 505/815; 505/919; 505/920; 505/921
[58] Field of Search .................................. 29/599; 148/98; 505/815, 919, 920, 921

[56] References Cited

U.S. PATENT DOCUMENTS

| | | | |
|---|---|---|---|
| 4,003,762 | 1/1977 | Ceresara et al. | 29/599 X |
| 4,008,102 | 2/1977 | Muller et al. | 29/599 X |
| 4,088,512 | 5/1978 | Pickus et al. | 29/599 X |
| 4,223,434 | 9/1980 | Wang et al. | 29/599 |
| 4,983,228 | 1/1991 | Taub et al. | 29/599 X |

FOREIGN PATENT DOCUMENTS 2163353  6/1990  Japan.
5135636  6/1993  Japan.

OTHER PUBLICATIONS

Article entitled: "Development of 10KA Class $Nb_3Al$ Superconducting Cable by Jelly–Roll Process" by T. Ando et al.; Reprinted from IEEE Transactions On Magnetics, vol. 27, No. 2, Mar. 1991.

*Primary Examiner*—Joseph M. Gorski
*Attorney, Agent, or Firm*—W. G. Fasse; W. F. Fasse

[57] ABSTRACT

A method of manufacturing an $Nb_3Al$ superconducting wire includes a step of forming a wire by a jelly-roll process, a first thermal step of heating the obtained wire at a temperature of 500° to 700° C. for at least 10 hours for diffusing Al in Nb while suppressing formation of $Nb_3Al$, and a second thermal step of heating the wire, after the first thermal step, at a temperature of 800° to 1050° C. for about 0.01 to 10 hours, thereby forming $Nb_3Al$. In the jelly-roll process, a sheet of Nb and a sheet of Al are lap-wound on a copper core. The material obtained by such lap winding is inserted in a copper pipe, and then subjected to drawing. The drawn wire is cut to obtain a plurality of segments. The plurality of segments are bundled and charged in a copper pipe, and then subjected to drawing. The resulting drawn wire is subjected to the first and second thermal steps. In this manner a superconducting material having a high critical current density under a high magnetic field is obtained.

16 Claims, 1 Drawing Sheet

METHODS OF MANUFACTURING NB₃AL SUPERCONDUCTING WIRE AND COIL

BACKGROUND OF THE INVENTION

1. Field of the Invention

The present invention relates to methods of manufacturing $Nb_3Al$ based superconducting wire and coil, and more particularly, it relates to methods of manufacturing a wire and a coil for high field superconducting magnets which are applied to analytical NMR, nuclear fusion, power storage and the like.

2. Description of the Background Art

It is expected that an intermetallic compound superconducting material of $Nb_3X$, such as $Nb_3Al$, $Nb_3Sn$ or $Nb_3Ge$, can be used in a high magnetic field in which an alloy superconducting material of NbTi or the like cannot be used. In particular, it has been confirmed by study of its physical properties that an $Nb_3Al$ superconducting material has an excellent critical current property and excellent characteristics of the stress-strain effect under a high magnetic field.

At first, $Nb_3Al$ could only be produced through a heat treatment at a high temperature of at least 1600° C. for a short time. Therefore, it was regarded as impossible to produce wires of such a material in a high volume. However, it has recently been clarified that $Nb_3Al$ can also be formed at a temperature of not more than 1600° C., if a diffusion length between Nb and Al is extremely small. On the basis of such a recognition, there have been developed a powder metallurgy (PM) process, a composite working process such as a tube process and clad chip extrusion, and a jelly-roll process for manufacturing an $Nb_3Al$ superconducting wire. Among such processes, the jelly-roll process is particularly useful for manufacturing a practical wire.

$Nb_3Al$, which is an intermetallic compound, is so mechanically fragile that the critical current is changed due to the strain and/or the stress applied to the material. In general, it is not easy to work an $Nb_3Al$ superconducting wire, unlike an NbTi superconducting wire. In order to manufacture an $Nb_3Al$ superconducting coil, it has typically been attempted to coil a wire which is prepared by composing Nb and Al in a state that does not form a compound and thereafter forming $Nb_3Al$ in the coil by a heat treatment. However, it is difficult to perform a sufficient heat treatment on such a coil having a relatively large volume and relatively high thermal capacity for forming a compound at a high temperature in a short time. Because a copper or copper alloy matrix is used as a stabilizer in such a superconductor, further, it is necessary to perform the heat treatment at a temperature lower than the melting point of copper, i.e., not more than about 1083° C.

Under such conditional restrictions, a process of forming $Nb_3Al$ has been found, which involves directly heating a composite material prepared by overlapping an Al layer and an Nb layer with each other at 800° to 850° C. for 1 to 10 hours. The superconducting material prepared by such a process exhibits a higher current density than an $Nb_3Sn$ superconducting material prepared by a conventional bronze process in a magnetic field of not more than about 12 T. In a higher magnetic field, however, this material cannot have a sufficient current density. While $Nb_3Al$ itself is regarded as originally having a critical magnetic field of about 30 T, a superconducting material prepared by the aforementioned process has a critical magnetic field of about 20 T.

SUMMARY OF THE INVENTION

An object of the present invention is to provide a process capable of manufacturing an $Nb_3Al$ based superconducting material which exhibits a high current density in a higher magnetic field than the prior art.

Another object of the present invention is to provide a process capable of manufacturing an $Nb_3Al$ based superconducting material which exhibits a higher critical magnetic field than the prior art.

The present invention is characterized in that a heat treatment for forming an $Nb_3Al$ based superconducting material is divided into at least two stages. A first thermal step is adapted to diffuse Al in Nb while suppressing formation of an $Nb_3Al$ based superconductor. A second thermal step is adapted to form an $Nb_3Al$ based superconductor. A heating temperature in the first thermal step is lower than that in the second thermal step. On the other hand, a heating time in the second thermal step is preferably shorter than that in the first thermal step. The first and second thermal steps may be continuously or intermittently carried out. When these steps are intermittently carried out, another step such as a winding step may be interposed between the two steps. In the present invention, it is important to diffuse Al in Nb by a heat treatment before forming an $Nb_3Al$ based superconductor, in order to manufacture a material having a high critical magnetic field.

A method of manufacturing an $Nb_3Al$ based superconducting wire is provided according to an aspect of the present invention. This method comprises a step of forming a wire containing a first solid consisting essentially of a metal selected from the group consisting of Nb and an Nb alloy, a second solid in contact with the first solid, consisting essentially of a metal selected from the group consisting of Al and an Al alloy, and a matrix for stabilization covering the first and second solids, a first thermal step of heating the wire for diffusing Al in Nb while suppressing formation of an $Nb_3Al$ based superconductor, and a second thermal step of heating the wire, passing through the first thermal step, at a temperature which is higher than that in the first thermal step thereby forming an $Nb_3Al$ based superconductor.

A method of manufacturing an $Nb_3Al$ based superconducting coil is provided according to another aspect of the present invention. This method comprises a step of forming a wire containing a first solid consisting essentially of a metal which is selected from the group consisting of Nb and an Nb alloy, a second solid, being in contact with the first solid, consisting essentially of a metal which is selected from the group consisting of Al and an Al alloy, and a matrix for stabilization covering the first and second solids, a step of coiling the wire, a first thermal step of heating the as-obtained coil for diffusing Al in Nb while suppressing formation of an $Nb_3Al$ based superconductor, and a second thermal step of heating the coil, which has passed through the first thermal step, at a temperature higher than that in the first thermal step thereby forming an $Nb_3Al$ based superconductor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
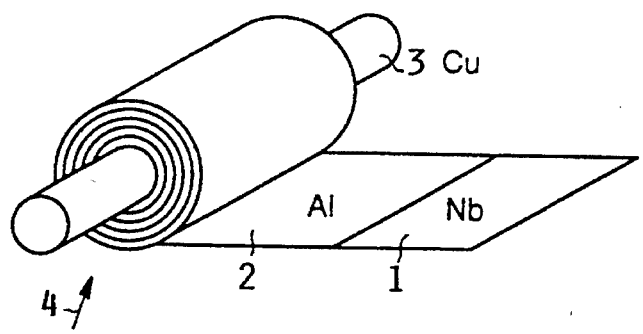
FIGS. 1A, 1B, 1C and 1D are perspective views typically showing a process of manufacturing an $Nb_3Al$ based superconducting wire or coil according to an example of the present invention.

According to the present invention, pure Nb or an Nb alloy, and pure Al or an Al alloy are employed for forming an $Nb_3Al$ superconducting material. Metals selected from the group consisting of Ge, Sn, Ti, Si, Hf, Ta, Zr, Mg, Be and combinations thereof are employed as components of these alloys. A compound superconducting material which is formed by reaction between Nb or an Nb alloy and Al or an Al alloy is $Nb_3Al$, $Nb_3(Al-Y)$ or a combination thereof. Symbol Y represents an element forming the Nb or Al alloy, which can be Ge, Sn, Ti, Si, Hf, Ta, Zr, Mg, Be or a combination thereof. A matrix covering the superconductor is preferably prepared from copper or a copper alloy, which serves as a stabilizing material.

In order to manufacture a practical superconducting wire having high performance, the following conditions must be satisfied:

(a) A multifilamentary wire can be easily manufactured.

(b) A stabilized wire can be easily manufactured.

(c) A long wire can be manufactured.

A jelly-roll process is a useful process that can satisfy these conditions. In a preferred mode of the present invention, it is possible to form a wire according to such a jelly-roll process. In the jelly-roll process, a first sheet consisting essentially of a metal selected from the group consisting of Nb and an Nb alloy and a second sheet consisting essentially of a metal selected from the group consisting of Al and an Al alloy are lap-wound, i.e. jelly-rolled on a stabilizing material. The material obtained by such lap winding is inserted in a pipe of a stabilizing material. Then, the as-obtained material is subjected to drawing. In such drawing, it is possible to obtain a hexagonal wire as needed. The wire obtained by the drawing is cut to obtain a plurality of segments. The plurality of segments are bundled and charged in a pipe of a stabilizing matrix. This multifilamentary rod is subjected to drawing. A multifilamentary wire obtained by this drawing is twisted, molded or insulated as needed. The wire having a wire diameter for serving as a final product is subjected to first and second thermal steps.

It is possible to form a superconducting coil by a react-and-wind process of coiling the as-obtained wire after heat treatments, or a wind-and-react process of coiling the as-drawn wire and thereafter heat treating the same. The latter process can preferably be employed for preparing a coil for a small magnet. On the other hand, the former process is employed for preparing a coil which is to be used for a large magnet for nuclear fusion or power storage.

According to the present invention, a temperature which is applied in the first thermal step is preferably within a range of about 500° to 700° C. Further, a treatment time in the first thermal step is preferably at least about 10 hours. It is possible to sufficiently diffuse Al within the aforementioned temperature range. If the temperature is higher than 700° C., parts of Nb and Al chemically react with each other to form an $Nb_3Al$ compound before Al is sufficiently diffused, which reduces the amount of the finally obtained compound superconductor.

A temperature which is applied in the second thermal step is preferably 800° to 1050° C. The time of the second thermal step is preferably about 0.01 to 10 hours. The temperature is set to be not more than about 1050° C., since the matrix is often prepared from copper having a melting point of about 1083° C. If the temperature is lower than 800° C., it is difficult to obtain a superconductor in a sufficient amount by reaction. If the heat treatment time is too long, on the other hand, crystal grains forming the superconductor are so enlarged that the critical current density of the as-obtained material is reduced. Thus, the time for the second thermal step is preferably not more than about 10 hours.

The $Nb_3Al$ based compound is stably formed by a heat treatment at a high temperature. On the other hand, another compound which does not exhibit superconductivity is formed with a superconductor by a heat treatment at a low temperature, and hence the obtained material has a low critical current density. From this point of view, it is necessary to form the superconductor at a temperature as high as possible. If the heat treatment is continued at high temperature, however, $Nb_3Al$ crystals which are formed in a short time are thickened or enlarged to reduce grain boundaries which serve as pinning points of the magnetic field. Consequently, the critical current density is reduced although the obtained material has a high critical magnetic field. According to the present invention, Al is first sufficiently thermal-diffused in Nb at a temperature which is lower than that for forming an $Nb_3Al$ based compound. Thus, a more finely mixed state of Nb and Al is attained. After the thermal diffusion, a heat treatment is performed at a temperature within a proper range for allowing stoichiometric reaction between Nb and Al, whereby it is possible to form a larger amount of an $Nb_3Al$ based compound in a shorter time. This process suppresses thickening or enlargement of crystals, to provide a superconducting material which exhibits a high critical current density under a high magnetic field. According to the present invention, it is possible to obtain a large amount of $Nb_3Al$ based superconducting material having a stoichiometric composition, which exhibits excellent superconductivity under a high magnetic field.

Figure 1B:
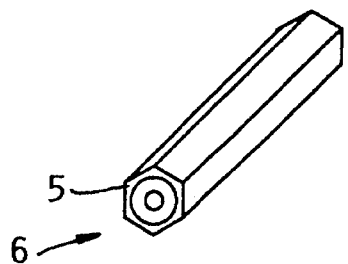
Figure 1C:
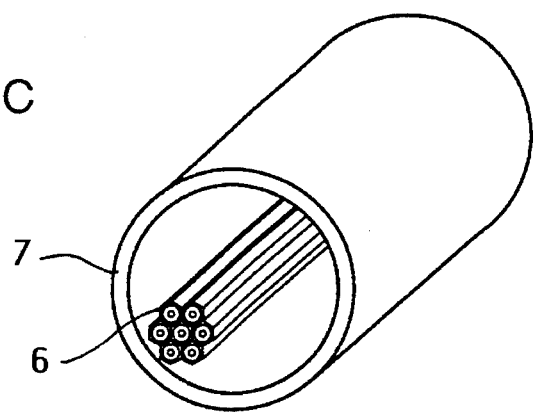
Figure 1D:
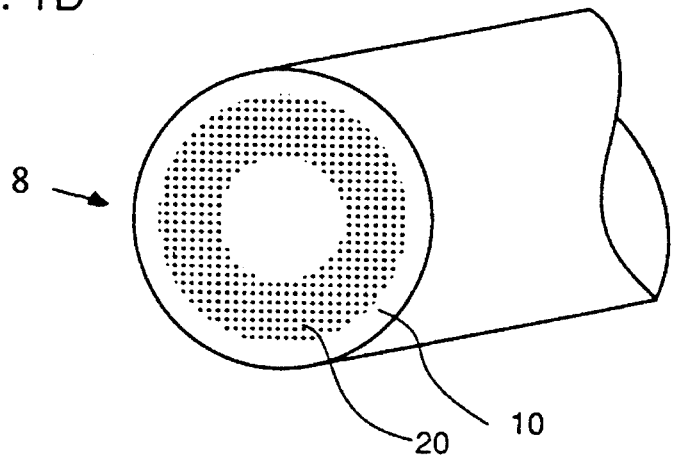

A specific example according to the invention will now be described. As shown in FIG. 1A, an Nb plate of 800 mm in length and 0.2 mm in thickness was overlapped with Al foil 2 of 600 mm in length and 0.06 mm in thickness, and wound on a copper bar 3 of 5 mm in diameter. In such lap winding, only the Nb plate 1 was first wound on the copper bar 3 by three turns and then the Al foil 2 was overlapped on the Nb plate, to be wound on the copper bar 3 together with the Nb plate 1 by 600 mm. Then, only the remaining part of the Nb plate 1 was wound for three turns, thereby forming a composite material 4 having a center of copper. The obtained composite material 4 was inserted in a copper pipe 5 of 20 mm in outer diameter and 18 mm in inner diameter, and subjected to drawing. The obtained hexagonal wire was cut to form a number of segments 6. FIG. 1B shows the shape of each segment 6. Referring to FIG. 1C, 91 of such segments 6 were bundled and charged in a copper pipe 7 of 20 mm in outer diameter and 18 mm in inner diameter. Ends of this copper pipe were sealed by welding, and the obtained material was drawn to form a wire 8 of about 0.8 mm in diameter. As shown in FIG. 1D, the obtained wire 8 has a number of Nb/Al filaments 20 in a Cu matrix 10. Each Nb/Al filament 20 is formed from a corresponding one of the original composite material jelly-rolls 4 and the Cu matrix 10 is formed from the copper bars 3, copper pipes 5, and copper pipe 7.

The obtained wire 8 was wound on a spool of 40 mm in diameter by five turns, to prepare a coil for a test. Two such coils were prepared for a heat treatment test. The obtained coils were subjected to the following two heat treatments respectively:

A. A heat treatment at 800° C. for five hours.

B. A heat treatment at 650° C. for 100 hours, followed by another heat treatment at 800° C. for five hours (two-stage heat treatments).

The heat treatment A is according to a conventional method, and the heat treatment B is according to the inventive method. Table 1 shows characteristics of superconducting coils obtained through the heat treatment conditions A and B respectively. This Table shows critical current densities (Jc) in superconducting parts of the respective samples under magnetic fields of 8 T, 12 T and 15 T, as well as critical magnetic fields of these samples. As clearly understood from this Table, it is possible to obtain a higher critical magnetic field and a higher critical current density by combining a heat treatment step performed at a low temperature for a long time with a heat treatment step performed at a high temperature for a short time, as compared with a single heat treatment step performed at a high temperature.

TABLE 1

| Condition | Jc(8T) (A/mm$^2$) | Jc(12T) (A/mm$^2$) | Jc(15T) (A/mm$^2$) | Critical Magnetic Field (T) |
| --- | --- | --- | --- | --- |
| A | 1250 | 400 | 130 | 19 |
| B | 1600 | 600 | 300 | 22 |

On the other hand, it is also possible to heat-treat a wire of about 0.8 mm in diameter obtained by drawing, in its wire form as such, without winding on a spool. Also in this case, it is possible to achieve through the heat treatment B a wire that is superior in superconductivity to a wire obtained through the heat treatment A, which is also shown in Table 1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an Nb$_3$Al based superconducting wire, comprising:

a) forming a wire comprising a first solid consisting essentially of a metal selected from the group consisting of Nb and Nb alloys, a second solid arranged in contact with said first solid and consisting essentially of a metal selected from the group consisting of Al and Al alloys, and a matrix for stabilization covering said first and second solids;

b) performing a first thermal step of heating said wire at a first temperature within a range from about 500° C. to about 700° C., thereby diffusing Al of said second solid into Nb of said first solid while suppressing formation of an Nb$_3$Al based superconductor; and c) performing a second thermal step of heating said wire, after said first thermal step, at a second temperature within a range from about 800° C. to about 1050° C., thereby forming an Nb$_3$Al based superconductor.

2. The method of claim 1, wherein said wire forming step comprises a jelly-roll process.

3. The method of claim 2, wherein said jelly-roll process comprises lap-winding a first sheet consisting essentially of said first solid and a second sheet consisting essentially of said second solid, on a core comprising a first stabilizing material, thereby forming a jelly-roll structure, and wherein said wire forming step further comprises inserting said jelly-roll structure in a pipe of a second stabilizing material, drawing said pipe containing said jelly-roll structure, thereby forming a wire strand, cutting said wire strand into a plurality of segments, bundling a plurality of said segments and charging the same into a second pipe of a stabilizing matrix material, and drawing said second pipe containing said segments, thereby forming said wire having a wire diameter of a final product.

4. The method of claim 3, wherein said first stabilizing material, said second stabilizing material and said stabilizing matrix material each consist essentially of a metal selected from the group consisting of copper and copper alloys.

5. The method of claim 1, wherein said matrix consists essentially of a metal selected from the group consisting of copper and copper alloys.

6. The method of claim 1, including performing said first thermal step out for at least about 10 hours, and performing said second thermal step for about 1 to about 10 hours.

7. The method of claim 1, wherein said Nb alloy and said Al alloy include at least one metal selected from the group consisting of Ge, Sn, Ti, Si, Hf, Ta, Zr, Mg, Be and combinations thereof.

8. The method of claim 1, further comprising winding said wire, thereby performing a coil after said second thermal step.

9. The method of claim 1, further comprising winding said wire, thereby forming a coil, between said first and second thermal steps.

10. A method of manufacturing an Nb$_3$Al based superconducting coil, comprising:

a) forming a wire comprising a first solid consisting essentially of a metal selected from the group consisting of Nb and Nb alloys, a second solid arranged in contact with said first solid and consisting essentially of a metal selected from the group consisting of Al and Al alloys, and a matrix for stabilization covering said first and second solids;

b) a step of coiling said wire into a coil;

c) performing a first thermal step of heating said coil at a first temperature within a range from about 500° C. to about 700° C., thereby diffusing Al of said second solid into Nb of said first solid while suppressing formation of an Nb$_3$Al based superconductor; and d) performing a second thermal step of heating said coil, after said first thermal step, at a second temperature within a range from about 800° C. to about 1050° C., thereby forming an Nb$_3$Al based superconductor.

11. The method of claim 10, wherein said wire forming step comprises a jelly-roll process.

12. The method of claim 11, wherein said jelly-roll process comprises lap-winding a first sheet consisting essentially of said first solid and a second sheet consisting essentially of said second solid, on a core comprising a first stabilizing material, thereby forming a jelly-roll structure, and wherein said wire forming step further comprises inserting said jelly-roll structure into a pipe of a second stabilizing material, drawing said pipe containing said jelly-roll structure, thereby forming a wire strand, cutting said wire strand into a plurality of segments, bundling a plurality of said segments and charging the same into a second pipe of a stabilizing matrix material, and drawing said second pipe containing said segments, thereby forming said wire having a wire diameter of a final product.

13. The method of claim 12, wherein said first stabilizing material, said second stabilizing material and said stabilizing matrix material each consist essentially of a metal selected from the group consisting of copper and copper alloys.

14. The method of claim 10, wherein said matrix consists essentially of a metal selected from the group consisting of copper and copper alloys.

15. The method of claim 10, including performing said first thermal step for at least about 10 hours, and performing said second thermal step for about 1 to about 10 hours.

16. The method of claim 10, wherein said Nb alloy and said Al alloy include at least one metal selected from the group consisting of Ge, Sn, Ti, Si, Hf, Ta, Zr, Mg, Be and combinations thereof.

* * * * *